US011146226B2

(12) United States Patent
Sakai

(10) Patent No.: US 11,146,226 B2
(45) Date of Patent: Oct. 12, 2021

(54) ANALOG SWITCH CIRCUIT, VOLUME CIRCUIT, AND SEMICONDUCTOR INTEGRATED CIRCUIT

(71) Applicant: ROHM Co., LTD., Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/908,870

(22) Filed: Jun. 23, 2020

(65) Prior Publication Data

US 2020/0412317 A1 Dec. 31, 2020

(30) Foreign Application Priority Data

Jun. 25, 2019 (JP) ............................ JP2019-117292

(51) Int. Cl.
*H03K 17/687* (2006.01)
*H03G 7/06* (2006.01)

(52) U.S. Cl.
CPC ............. *H03G 7/06* (2013.01); *H03K 17/687* (2013.01)

(58) Field of Classification Search
CPC ............................... H03G 7/06; H03K 17/687
USPC ................................................. 327/108–112
See application file for complete search history.

(56) References Cited

U.S. PATENT DOCUMENTS 5,422,588 A * 6/1995 Wynne ................. H03K 17/145 327/427
8,847,672 B2 * 9/2014 Prabhakar, III ..... H01L 27/0629 327/537
9,214,932 B2 * 12/2015 Clausen ............... H03K 17/162
2010/0013532 A1 * 1/2010 Ainspan .................. H03L 7/107 327/159
2014/0327470 A1 * 11/2014 Nazarian .......... H03K 19/17764 326/38

FOREIGN PATENT DOCUMENTS

JP 2018050289 A 3/2018

OTHER PUBLICATIONS

New Japan Radio Co., Ltd., 4-circuit analog switch data sheet, [online], the Internet (https://www.njr.co.jp/products/semicon/PDF/NJU4066B_J.pdf).

* cited by examiner

*Primary Examiner* — Tomi Skibinski
(74) *Attorney, Agent, or Firm* — Chip Law Group

(57) ABSTRACT

Provided is an analog switch circuit that allows switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, and a controller that includes a voltage generating circuit that generates a high-side voltage according to the upper supply voltage and the input voltage and a low-side voltage according to the input voltage and the lower supply voltage. The controller can control a gate and a back gate of each of the main N-channel and P-channel MOS transistors based on the high-side and low-side voltages.

17 Claims, 14 Drawing Sheets

500
OUT
IN0
VIN0
IN1
VIN1
INM
VINM
VGP0
MP0
VH
VL
MN0
VGN0
VGP1
MP1
MN1
VGN1
VGPM
MPM
MNM
VGNM
510
520
VDD
VSS
530_0
530_1
530_M
CNT0
CNT1
CNTM

ANALOG SWITCH CIRCUIT, VOLUME CIRCUIT, AND SEMICONDUCTOR INTEGRATED CIRCUIT

CROSS REFERENCE TO RELATED APPLICATIONS

The present disclosure contains subject matter related to that disclosed in Japanese Priority Patent Application JP 2019-117292 filed in the Japan Patent Office on Jun. 25, 2019, the entire content of which is hereby incorporated by reference.

BACKGROUND

The present disclosure relates to an analog switch circuit, a volume circuit including the analog switch circuits, and a semiconductor integrated circuit.

For an electronic circuit that deals with an analog signal, an analog switch for switching between transmission and interruption of the analog signal is used. The analog switch is referred to also as a complementary metal oxide semiconductor (CMOS) switch or transfer gate. FIG. 1 is a diagram depicting the basic configuration of an analog switch 10. The analog switch 10 includes an N-channel MOS (NMOS) transistor 12 and a P-channel MOS (PMOS) transistor 14 that are connected in parallel. When a control signal CNT is at a high level, a supply voltage $V_{DD}$ is applied to the gate of the NMOS transistor 12 and a ground voltage $V_{SS}$ is applied to the gate of the PMOS transistor 14, so that the analog switch 10 becomes the on-state. Conversely, when the control signal CNT is at a low level, the ground voltage $V_{SS}$ is applied to the gate of the NMOS transistor 12 and the supply voltage $V_{DD}$ is applied to the gate of the PMOS transistor 14, so that the analog switch 10 becomes the off-state. An analog switch in which an input terminal IN and an output terminal OUT can be interchanged is disclosed in New Japan Radio Co., Ltd., 4-circuit analog switch data sheet, [online], the Internet <URL:https://www.njr.co.jp/products/semicon/PDF/NJU4066B_J.pdf>. An example of the relate art is disclosed in Japanese Patent Laid-open No. 2018-50289.

SUMMARY

In an application to which a high voltage is input, the CMOS switch may need to be configured with high breakdown voltage elements. However, in the high breakdown voltage process, the cost becomes higher compared with the low breakdown voltage process. Furthermore, the degree of integration of transistors lowers.

The present disclosure is made in view of such a problem and it is desirable to provide an analog switch circuit that can transmit an input voltage higher than the breakdown voltage of an NMOS transistor and a PMOS transistor, a volume circuit including the analog switch circuits, and a semiconductor integrated circuit.

A mode of the present disclosure relates to an analog switch circuit that allows switching between an on-state and an off-state according to a control signal. The analog switch circuit includes a main input terminal that receives an input voltage, an output terminal, an upper-side power supply terminal that receives an upper supply voltage, a lower-side power supply terminal that receives a lower supply voltage, and a main NMOS transistor and a main PMOS transistor that are disposed in parallel between the main input terminal and the output terminal. The analog switch circuit includes also a controller that includes a voltage generating circuit that generates a high-side voltage according to the upper supply voltage and the input voltage and a low-side voltage according to the input voltage and the lower supply voltage. The controller is capable of controlling a gate and a back gate of each of the main NMOS transistor and the main PMOS transistor based on the high-side voltage and the low-side voltage.

Another mode of the present disclosure is also an analog switch circuit. This analog switch circuit includes a main input terminal that receives an input voltage, an output terminal, an upper-side power supply terminal that receives an upper supply voltage, and a lower-side power supply terminal that receives a lower supply voltage. The analog switch circuit includes also an NMOS transistor and a PMOS transistor that are disposed in parallel between the main input terminal and the output terminal, a first driver that applies one according to the control signal in a high-side voltage and a low-side voltage to a gate of the NMOS transistor, and a second driver that applies the other according to the control signal in the high-side voltage and the low-side voltage to a gate of the PMOS transistor. The analog switch circuit includes also a first resistor disposed between the upper-side power supply terminal and a first output node at which the high-side voltage is generated, a second resistor and a third resistor disposed in series between the upper-side power supply terminal and the main input terminal, a first transistor of a negative-positive-negative (NPN) type in which a base is connected to a first internal node that connects the second resistor and the third resistor and a collector is connected to the first output node, and a fourth resistor disposed between an emitter of the first transistor and the main input terminal. The analog switch circuit includes also a fifth resistor disposed between the lower-side power supply terminal and a second output node at which the low-side voltage is generated, a sixth resistor and a seventh resistor disposed in series between the lower-side power supply terminal and the main input terminal, a second transistor of a positive-negative-positive (PNP) type in which a base is connected to a second internal node that connects the sixth resistor and the seventh resistor and a collector is connected to the second output node, and an eighth resistor disposed between an emitter of the second transistor and the main input terminal.

Another mode of the present disclosure relates to a volume circuit. The volume circuit includes a resistance voltage dividing circuit that includes a plurality of resistive elements connected in series and has one end to which an input signal is applied, a plurality of analog switch circuits disposed corresponding to a plurality of taps of the resistance voltage dividing circuit, and a volume controller that controls the plurality of the analog switch circuits, in which at least one of the plurality of the analog switch circuits is an analog switch circuit that allows switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, MOS standing for metal oxide semiconductor, and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage.

Furthermore, the volume circuit includes a resistance voltage dividing circuit that includes a plurality of resistive elements connected in series and has one end to which an input signal is applied, and an analog switch circuit that receives voltages of a plurality of taps of the resistance voltage dividing circuit, the analog switch circuit allowing switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, MOS standing for metal oxide semiconductor, and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage, at least one sub-main input terminal that each receives a voltage arising from voltage dividing of the input voltage, at least one sub-N-channel MOS transistor each disposed between corresponding one of the at least one sub-main input terminal and the output terminal, and at least one sub-P-channel MOS transistor each disposed between corresponding one of the at least one sub-main input terminal and the output terminal, in which the low-side voltage is applied to a back gate of the at least one sub-N-channel MOS transistor and the high-side voltage is applied to a back gate of the at least one sub-P-channel MOS transistor.

Another mode of the present disclosure also relates to a semiconductor integrated circuit. The semiconductor integrated circuit includes a volume circuit including a resistance voltage dividing circuit that includes a plurality of resistive elements connected in series and has one end to which an input signal is applied, a plurality of analog switch circuits disposed corresponding to a plurality of taps of the resistance voltage dividing circuit, and a volume controller that controls the plurality of the analog switch circuits, in which at least one of the plurality of the analog switch circuits is an analog switch circuit that allows switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, MOS standing for metal oxide semiconductor, and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage.

What are obtained by mutually replacing any combinations of the above constituent elements and constituent elements and expressions of the present disclosure among method, device, system, and so forth are also effective as modes of the present disclosure.

According to one mode of the present disclosure, the input voltage higher than the breakdown voltage of the NMOS transistor and the PMOS transistor can be transmitted and use under a supply voltage higher than the breakdown voltage becomes possible.

DETAILED DESCRIPTION OF THE PREFERRED EMBODIMENTS

The present disclosure will be described below based on preferred embodiments with reference to the drawings. The same or equivalent constituent element, component, and processing depicted in the respective drawings are given the same numeral and overlapping description is omitted as appropriate. Furthermore, the embodiments are not what limit the disclosure but exemplification, and all characteristics described in the embodiments and combinations thereof are not necessarily essential matters of the disclosure.

In the present specification, "the state in which component A is connected to component B" includes also the case in which component A and component B are directly connected physically and the case in which component A and component B are indirectly connected with the intermediary of another member that does not have a substantial influence on the electrical connection state of them or does not impair functions and effects provided due to the coupling of them.

Similarly, "the state in which component C is disposed between component A and component B" includes also, besides the case in which component A and component C or component B and component C are directly connected, the case in which component A and component C or component B and component C are indirectly connected with the intermediary of another member that does not have a substantial influence on the electrical connection state of them or does not impair functions and effects provided due to the coupling of them.

Figure 1:
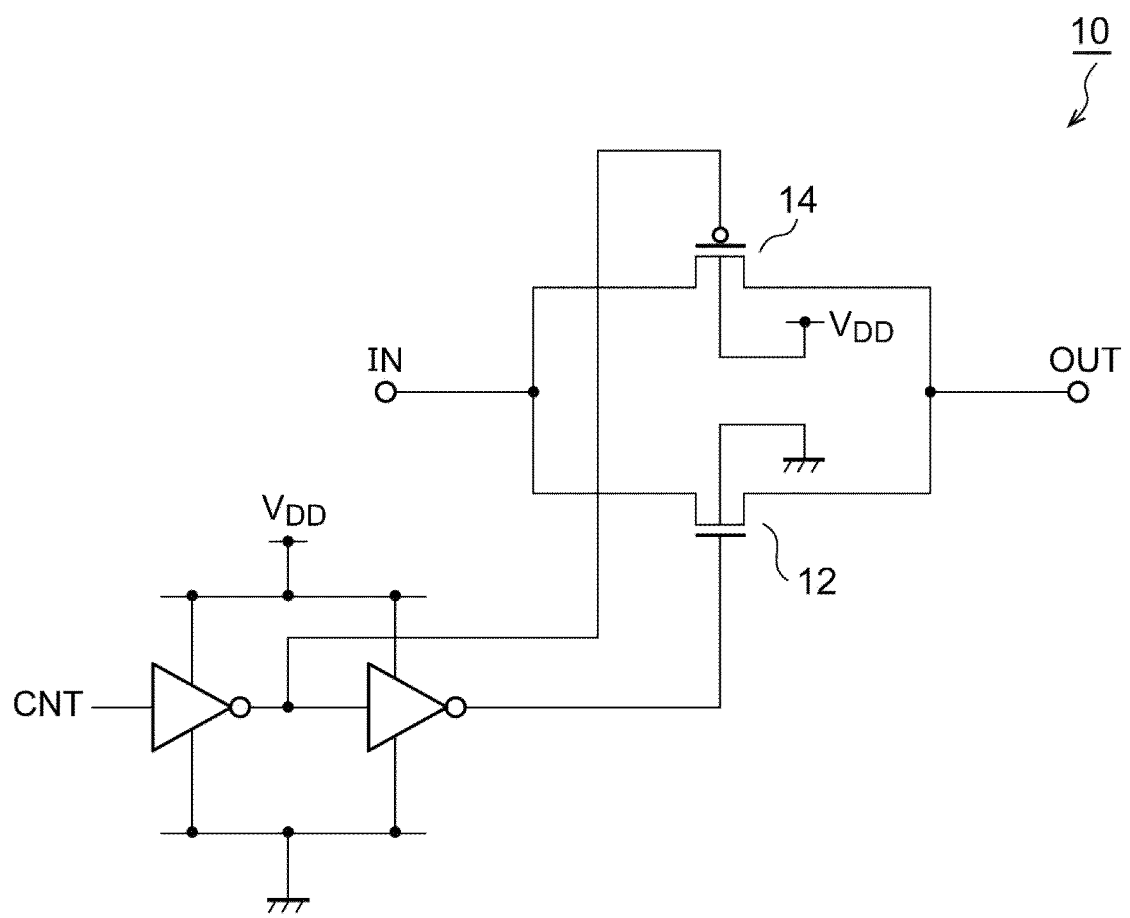
FIG. 1 is a diagram depicting the basic configuration of an analog switch.
Figure 2:
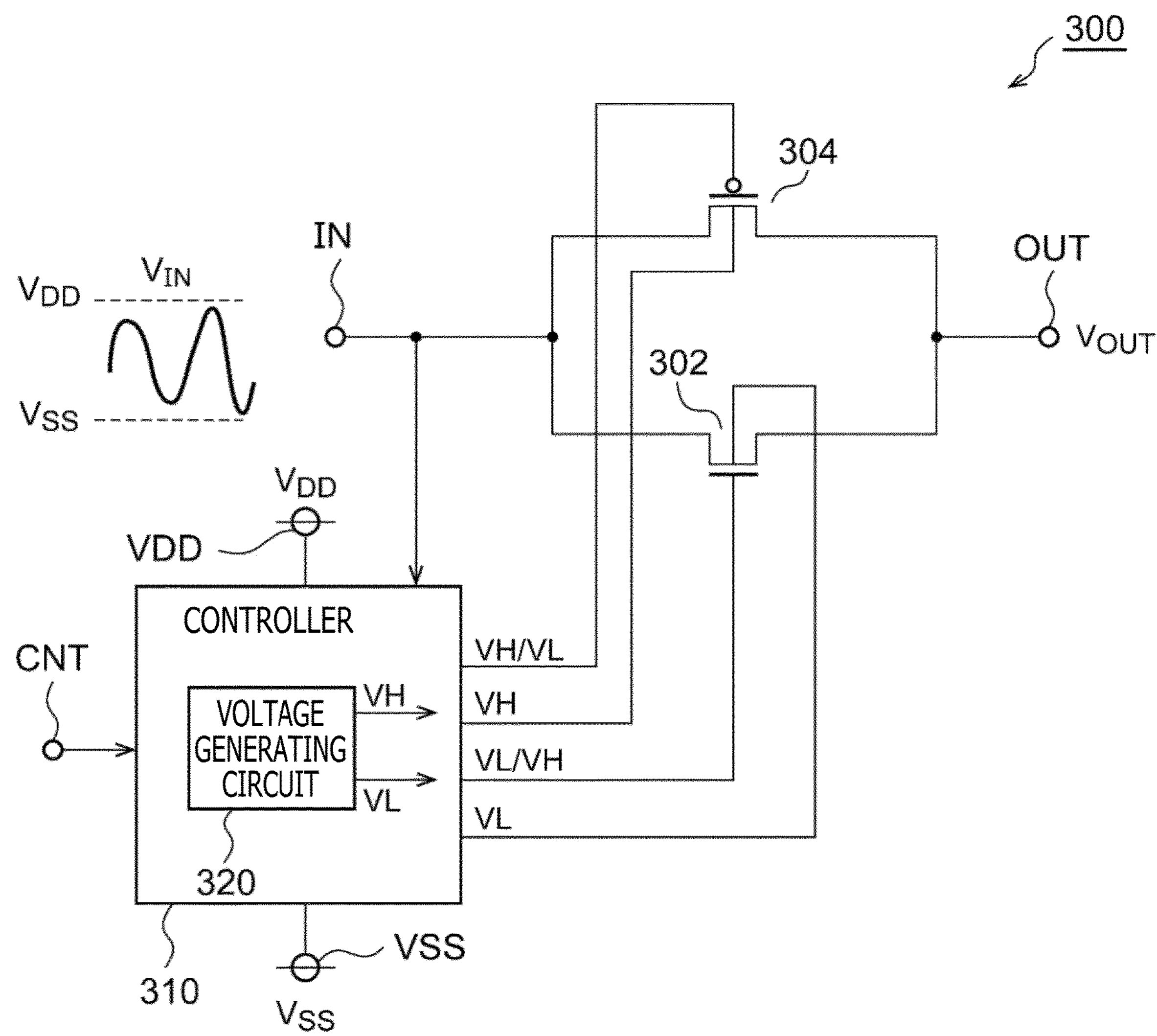
FIG. 2 is a circuit diagram of an analog switch circuit according to an embodiment.

FIG. 2 is a circuit diagram of an analog switch circuit 300 according to an embodiment. The analog switch circuit 300 has an input terminal IN, an output terminal OUT, a control terminal CNT, an upper-side power supply terminal $V_{DD}$, and a lower-side power supply terminal VSS. An upper supply voltage $V_{DD}$ and a lower supply voltage $V_{SS}$ are supplied to the upper-side power supply terminal $V_{DD}$ and the lower-side power supply terminal VSS, respectively. For example, the upper supply voltage $V_{DD}$ is a positive supply voltage and the lower supply voltage $V_{SS}$ is a negative supply voltage.

An analog input voltage $V_{IN}$ is input to the input terminal IN. Basically, the input voltage $V_{IN}$ varies in a voltage range of $V_{DD}$ to $V_{SS}$.

$$V_{SS} \le V_{IN} \le V_{DD}$$

The analog switch circuit 300 becomes an on-state when a first level (for example, high level) is input to the control terminal CNT, and becomes an off-state when a second level (for example, low level) is input to the control terminal CNT. In the on-state, a voltage $V_{OUT}$ equal to the input voltage $V_{IN}$ is generated at the output terminal OUT. In the off-state, the output terminal OUT becomes a high impedance state. Hereinafter, the signal given to the control terminal CNT will be referred to as a control signal CNT.

The analog switch circuit 300 includes a main NMOS transistor (hereinafter, referred to also as NMOS transistor) 302, a main PMOS transistor (hereinafter, referred to also as PMOS transistor) 304, and a controller 310. The NMOS transistor 302 and the PMOS transistor 304 are disposed in parallel between the input terminal IN and the output terminal OUT.

The controller 310 includes a voltage generating circuit 320 that generates a high-side voltage VH according to the upper supply voltage $V_{DD}$ and the input voltage $V_{IN}$ and a low-side voltage VL according to the input voltage $V_{IN}$ and the lower supply voltage $V_{SS}$. The high-side voltage VH and the low-side voltage VL satisfy the following expressions.

$$V_{IN} \le VH \le V_{DD}$$

$$V_{SS} \le VL \le V_{IN}$$

The controller 310 is capable of controlling the gate and the back gate of each of the NMOS transistor 302 and the PMOS transistor 304 based on the high-side voltage VH and the low-side voltage VL.

For example, in the on-state, the controller 310 applies the high-side voltage VH to the gate of the NMOS transistor 302 and applies the low-side voltage VL to the gate of the PMOS transistor 304. Furthermore, in the off-state, the controller 310 applies the low-side voltage VL to the gate of the NMOS transistor 302 and applies the high-side voltage VH to the gate of the PMOS transistor 304.

Moreover, in both the on-state and the off-state, the controller 310 may apply the low-side voltage VL to the back gate of the NMOS transistor 302 in a fixed manner and apply the high-side voltage VH to the back gate of the PMOS transistor 304 in a fixed manner.

The above is the basic configuration of the analog switch circuit 300. Subsequently, a specific configuration example of the analog switch circuit 300 will be described.

Figure 3:
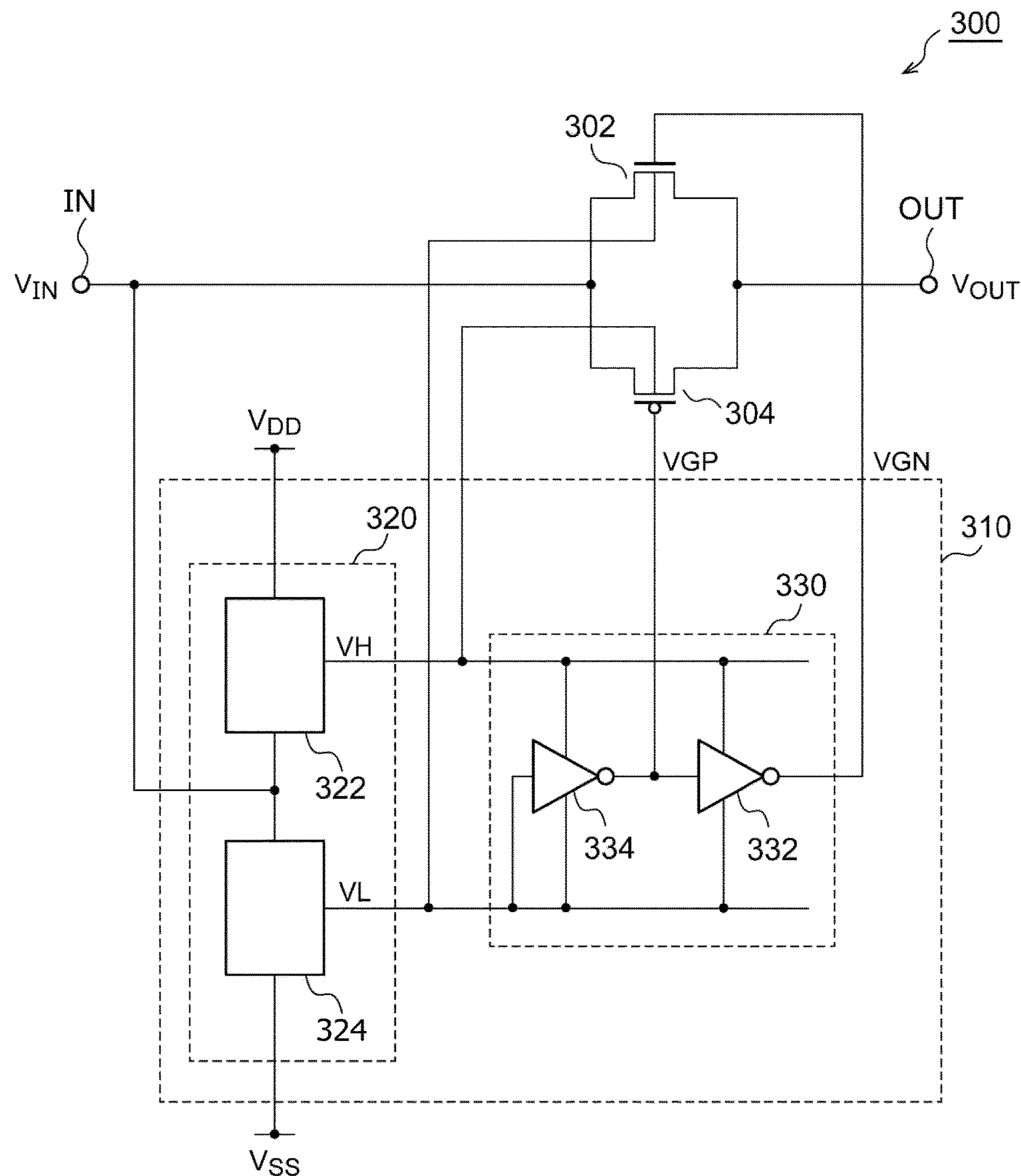
FIG. 3 is a circuit diagram depicting a configuration example of the analog switch circuit.

FIG. 3 is a circuit diagram depicting the configuration example of the analog switch circuit 300. The controller 310 includes the voltage generating circuit 320 and a driver 330.

The voltage generating circuit 320 generates the high-side voltage VH and the low-side voltage VL based on the upper supply voltage $V_{DD}$, the lower supply voltage $V_{SS}$, and the input voltage $V_{IN}$. The voltage generating circuit 320 includes a high-side voltage generating circuit 322 and a low-side voltage generating circuit 324.

The high-side voltage generating circuit 322 generates the high-side voltage VH based on the upper supply voltage $V_{DD}$ and the input voltage $V_{IN}$. The low-side voltage generating circuit 324 generates the low-side voltage VL based on the lower supply voltage $V_{SS}$ and the input voltage $V_{IN}$.

For example, the high-side voltage generating circuit 322 may carry out voltage dividing of the upper supply voltage $V_{DD}$ and the input voltage $V_{IN}$ to generate the high-side voltage VH. Similarly, the low-side voltage generating circuit 324 may carry out voltage dividing of the input voltage $V_{IN}$ and the lower supply voltage $V_{SS}$ to generate the low-side voltage VL. The high-side voltage VH and the low-side voltage VL in this case are represented by expressions (1) and (2).

$$VH=(\alpha \times V_{DD}+\beta \times V_{IN})/(\alpha+\beta) \quad (1)$$

$$VL=(\gamma \times V_{IN}+\delta \times V_{SS})/(\gamma+\delta) \quad (2)$$

α, β, γ, and δ are constants. α=δ and β=γ may be set.

Expressions (1) and (2) may include constant terms $Vc_1$ and $Vc_2$.

$$VH=(\alpha \times V_{DD}+\beta \times V_{IN}+Vc_1)/(\alpha+\beta) \quad (1')$$

$$VL=(\gamma \times V_{IN}+\delta \times V_{SS}+Vc_2)/(\gamma+\delta) \quad (2')$$

Alternatively, the high-side voltage generating circuit 322 may generate the high-side voltage VH by offsetting the upper supply voltage $V_{DD}$ toward the lower potential side according to the difference from the input voltage $V_{IN}$ ($V_{DD}-V_{IN}$). Similarly, the low-side voltage generating circuit 324 may generate the low-side voltage VL by offsetting the lower supply voltage $V_{SS}$ toward the higher potential side according to the difference from the input voltage $V_{IN}$ ($V_{IN}-V_{SS}$). The high-side voltage VH and the low-side voltage VL in this case are represented by expressions (3) and (4).

$$VH=V_{DD}-m(V_{DD}-V_{IN}) \quad (3)$$

$$VL=V_{SS}+n(V_{IN}-V_{SS}) \quad (4)$$

m and n are constants.

Expressions (3) and (4) may include constant terms $Vc_1$ and $Vc_2$.

$$VH=V_{DD}-m(V_{DD}-V_{IN})+V_{c1} \quad (3')$$

$$VL=V_{SS}+n(V_{IN}-V_{SS})+V_{c2} \quad (4')$$

The high-side voltage VH and the low-side voltage VL are supplied to the driver 330. When the control signal CNT is at an on-level (for example, high level), the driver 330 applies the high-side voltage VH to the gate of the NMOS transistor 302 and applies the low-side voltage VL to the gate of the PMOS transistor 304. Furthermore, when the control signal CNT is at an off-level (for example, low level), the driver 330 applies the low-side voltage VL to the gate of the NMOS transistor 302 and applies the high-side voltage VH to the gate of the PMOS transistor 304.

Although the configuration of the driver 330 is not particularly limited, the driver 330 includes a first driver 332 and a second driver 334, for example. The first driver 332 is capable of outputting one according to the control signal CNT in the high-side voltage VH and the low-side voltage VL. The second driver 334 is capable of outputting the other according to the control signal CNT in the high-side voltage VH and the low-side voltage VL.

The first driver 332 and the second driver 334 can be configured by using a buffer or inverter. In the configuration example of FIG. 3, the second driver 334 inverts the control signal CNT to generate a gate signal VGP of the PMOS transistor 304. The first driver 332 inverts the output VGP of the second driver 334 to generate a gate signal VGN of the NMOS transistor 302.

When expressions (1') and (3') are generalized, expression (5) is obtained. Similarly, when expressions (2') and (4') are generalized, expression (6) is obtained.

$$VH=a_1\cdot V_{IN}+b_1\cdot V_{DD}+Vc_1 \quad (5)$$

$$VL=a_2\cdot V_{IN}+b_2\cdot V_{SS}+Vc_2 \quad (6)$$

The parameters $a_1$, $b_1$, and $Vc_1$ are decided in such a manner that the gate-drain voltage (gate-source voltage) and the drain-back gate voltage (source-back gate voltage) of the NMOS transistor 302 do not exceed the breakdown voltage of the NMOS transistor in combinations of the assumed supply voltage $V_{DD}$ and input voltage $V_{IN}$.

Similarly, the parameters $a_2$, $b_2$, and $Vc_2$ are decided in such a manner that the gate-source voltage (gate-drain voltage) and the source-back gate voltage (drain-back gate voltage) of the PMOS transistor 304 do not exceed the breakdown voltage of the PMOS transistor in combinations of the assumed supply voltage $V_{SS}$ and input voltage $V_{IN}$. It should be noted that the term "breakdown voltage" here is the breakdown voltage between terminals and is not the substrate breakdown voltage. A high breakdown voltage is needed to improve the voltage between terminals, whereas the substrate breakdown voltage can be enhanced comparatively easily by burying an isolation insulating film in a semiconductor substrate (epitaxial substrate) even in a low breakdown voltage process.

The above is the configuration of the analog switch circuit 300. Subsequently, operation thereof will be described.

Figure 4A:
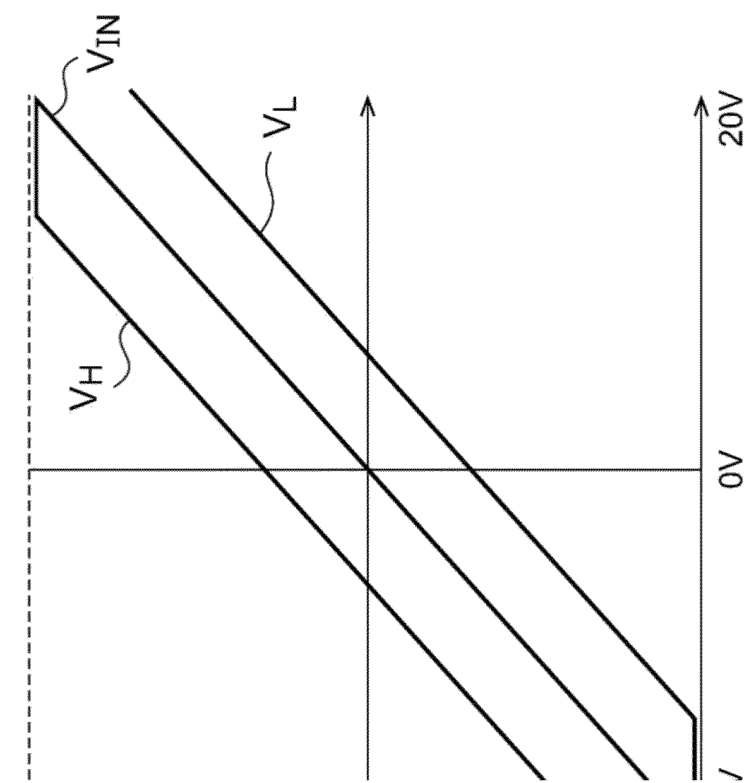
FIGS. 4A and 4B are diagrams for explaining operation of the analog switch circuit in FIG. 3.
Figure 4B:
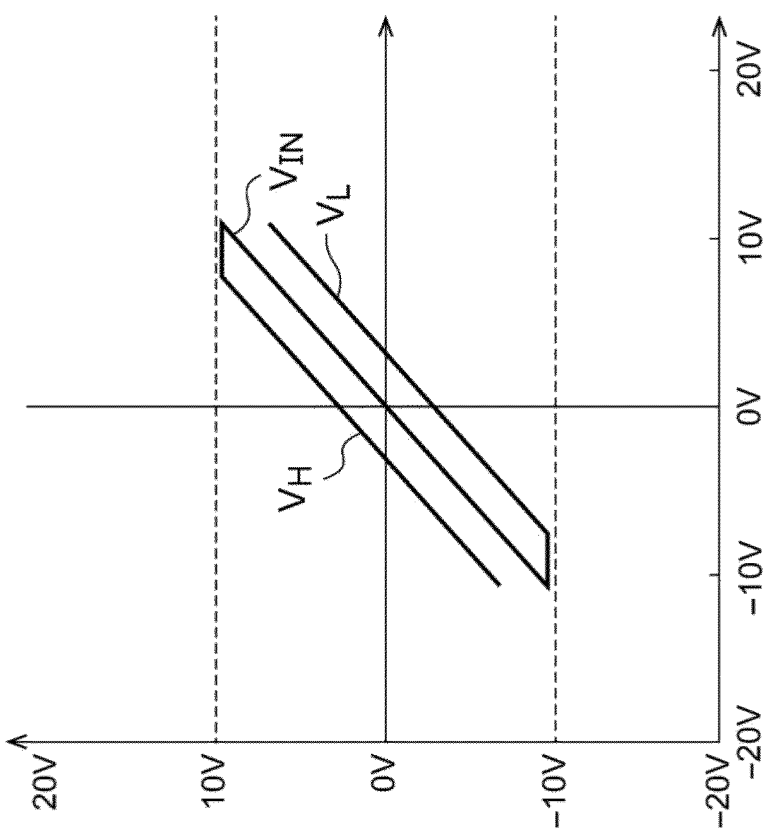

FIGS. 4A and 4B are diagrams for explaining the operation of the analog switch circuit 300 in FIG. 3. Here, $Vc_1=Vc_2=0$ and $a_1=a_2=1$ are set in expressions (5) and (6). In FIG. 4A, the dependence of each of the high-side voltage VH and the low-side voltage VL on the input voltage $V_{IN}$ when $V_{DD}$=20 V and $V_{SS}$=−20 V are set is depicted. In FIG. 4B, the dependence of each of the high-side voltage VH and the low-side voltage VL on the input voltage $V_{IN}$ when $V_{DD}$=10 V and $V_{SS}$=−10 V are set is depicted.

Figure 5:
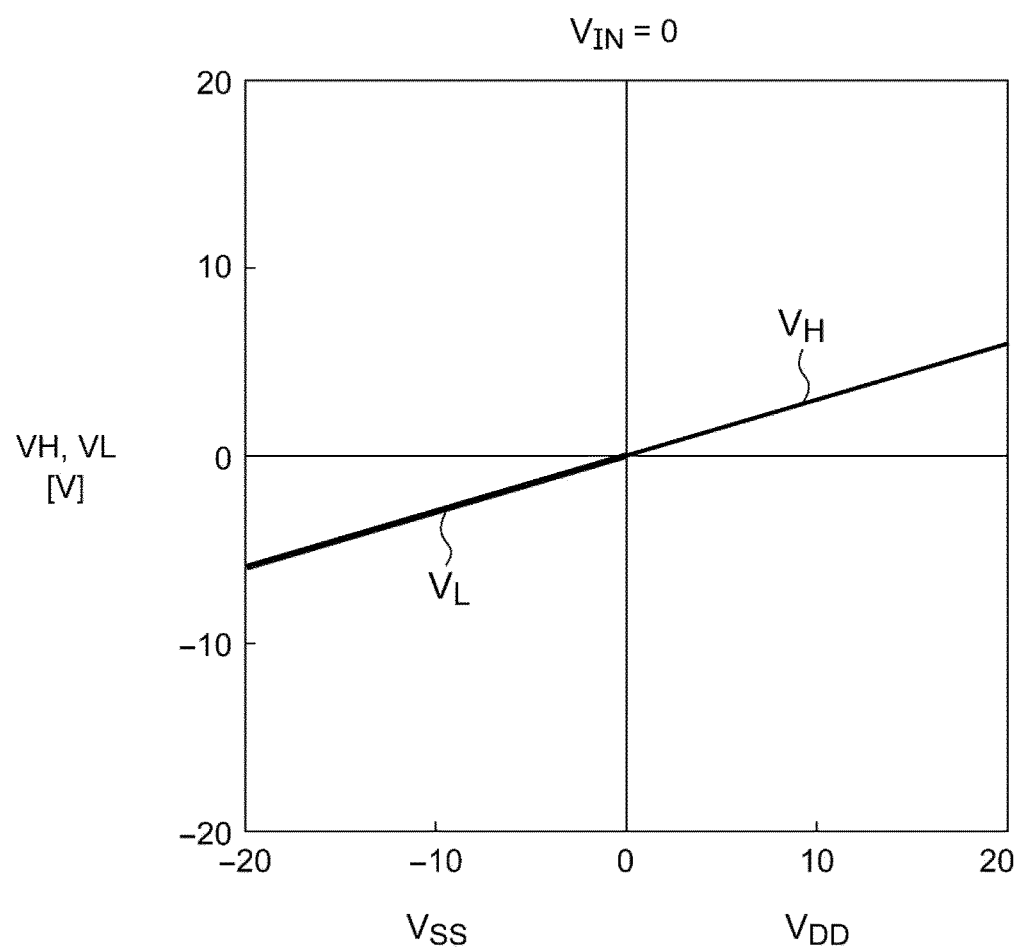
FIG. 5 is a diagram depicting the dependence of each of a high-side voltage VH and a low-side voltage VL on a supply voltage $V_{DD}$ or $V_{SS}$ when $V_{IN}$=0 V is set.

FIG. 5 is a diagram depicting the dependence of each of the high-side voltage VH and the low-side voltage VL on the supply voltage $V_{DD}$ or $V_{SS}$ when $V_{IN}$=0 V is set.

The above is the operation of the analog switch circuit 300. According to this analog switch circuit 300, by applying the high-side voltage VH according to the input voltage $V_{IN}$ and the upper supply voltage $V_{DD}$ and the low-side voltage VL according to the input voltage $V_{IN}$ and the lower supply voltage $V_{SS}$ to the gates and the back gates of the CMOS switch, the gate-source voltage, the gate-drain voltage, and the voltages applied between the source and the back gate and between the drain and the back gate can be suppressed in each of the PMOS transistor and the NMOS transistor.

For example, in the example of FIG. 4A, the voltage between terminals is suppressed to 14 V or lower even under the environment with the supply voltage of ±20 V. Therefore, approximately 15 V is sufficient as the breakdown voltage of the NMOS transistor 302 and the PMOS transistor 304.

Subsequently, a specific configuration example of the controller 310 will be described.

Embodiment Example 1

Figure 6:
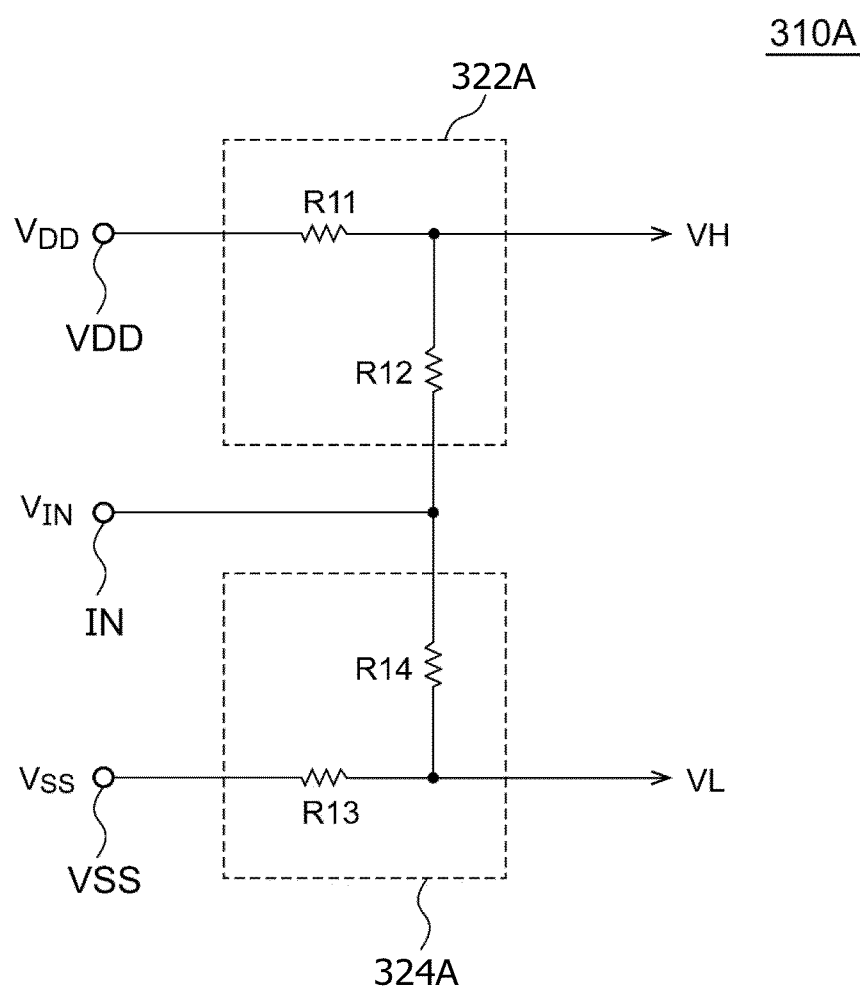
FIG. 6 is a circuit diagram of a controller according to embodiment example 1.
Figure 7A:
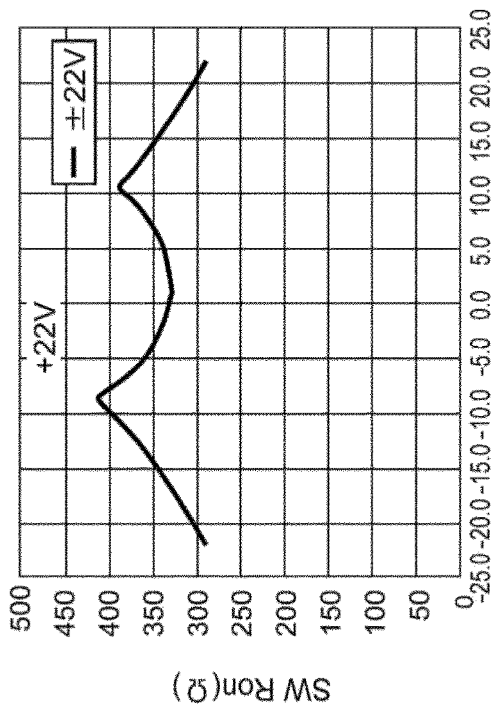
FIGS. 7A to 7D are diagrams depicting the on-resistance of the analog switch circuit when the controller in FIG. 6 is used.
Figure 7B:
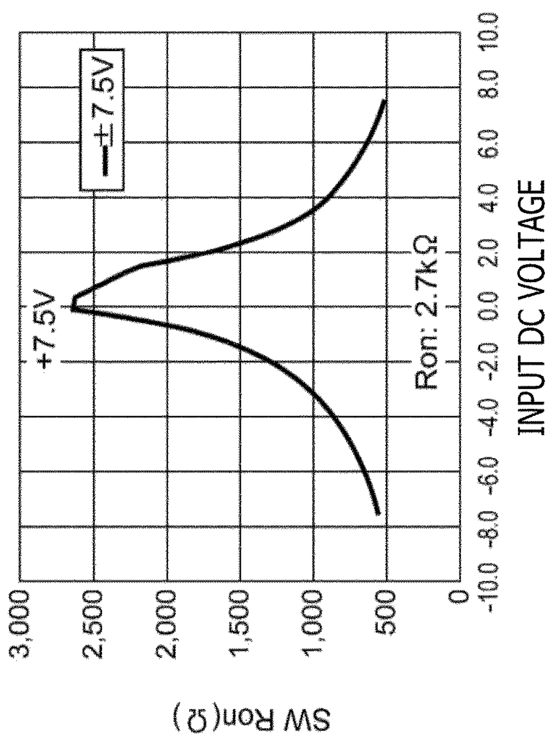
Figure 7C:
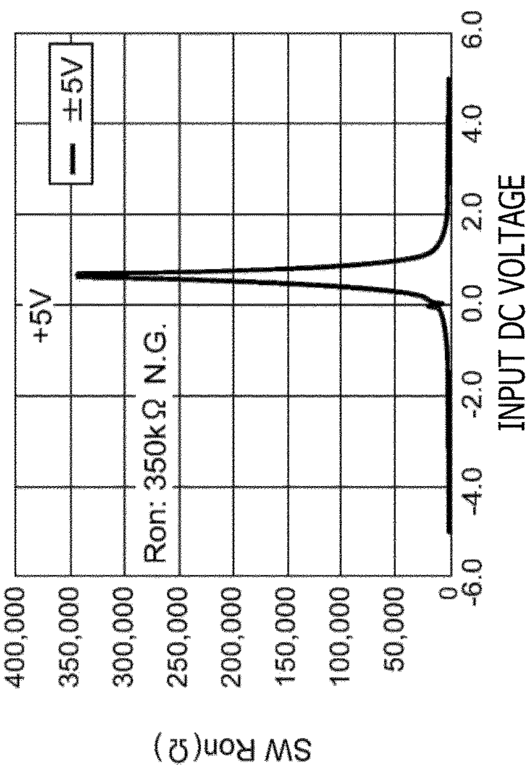
Figure 7D:
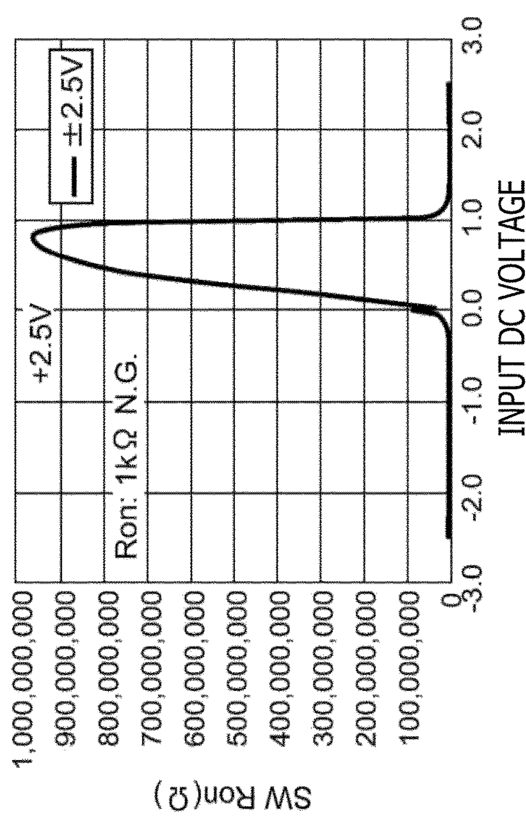

FIG. 6 is a circuit diagram of a controller 310A according to embodiment example 1. The controller 310A includes a high-side voltage generating circuit 322A and a low-side voltage generating circuit 324A. As the simplest configuration, the high-side voltage generating circuit 322A and the low-side voltage generating circuit 324A can be configured with a resistance voltage dividing circuit. The high-side voltage generating circuit 322A includes resistors R11 and R12. The high-side voltage VH is represented by expression (7).

$$VH=(R12\cdot V_{DD}+R11\cdot V_{IN})/(R11+R12) \quad (7)$$

When expression (7) is associated with expression (5), the following relationships are obtained.

$$a_1=R11/(R11+R12)$$

$$b_1=R12/(R11+R12)$$

$$Vc_1=0$$

Similarly, the low-side voltage generating circuit 324A includes resistors R13 and R14 and the low-side voltage VL is represented by expression (8).

$$VL=(R14\cdot V_{SS}+R13\cdot V_{IN})/(R13+R14) \quad (8)$$

When expression (8) is associated with expression (6), the following relationships are obtained.

$$a_2=R13/(R13+R14)$$

$$b_2=R14/(R13+R14)$$

$$Vc_2=0$$

FIGS. 7A to 7D are diagrams depicting the on-resistance of the analog switch circuit 300 when the controller 310A in FIG. 6 is used. FIGS. 7A to 7D depict the on-resistance when the supply voltages $V_{DD}$ and $V_{SS}$ are ±22 V, ±7.5 V, ±5 V, and ±2.5 V, respectively.

As is understood from FIGS. 7A to 7D, with the configuration of embodiment example 1 in FIG. 6, the on-resistance of the analog switch becomes higher when the supply voltage $V_{DD}$ ($V_{SS}$) becomes lower. For a use purpose in which low on-resistance is required, it becomes difficult to use the analog switch circuit 300 in a state of a low supply voltage. In embodiment example 2, a circuit that can be used even in a low supply voltage state will be described.

Embodiment Example 2

Figure 8:
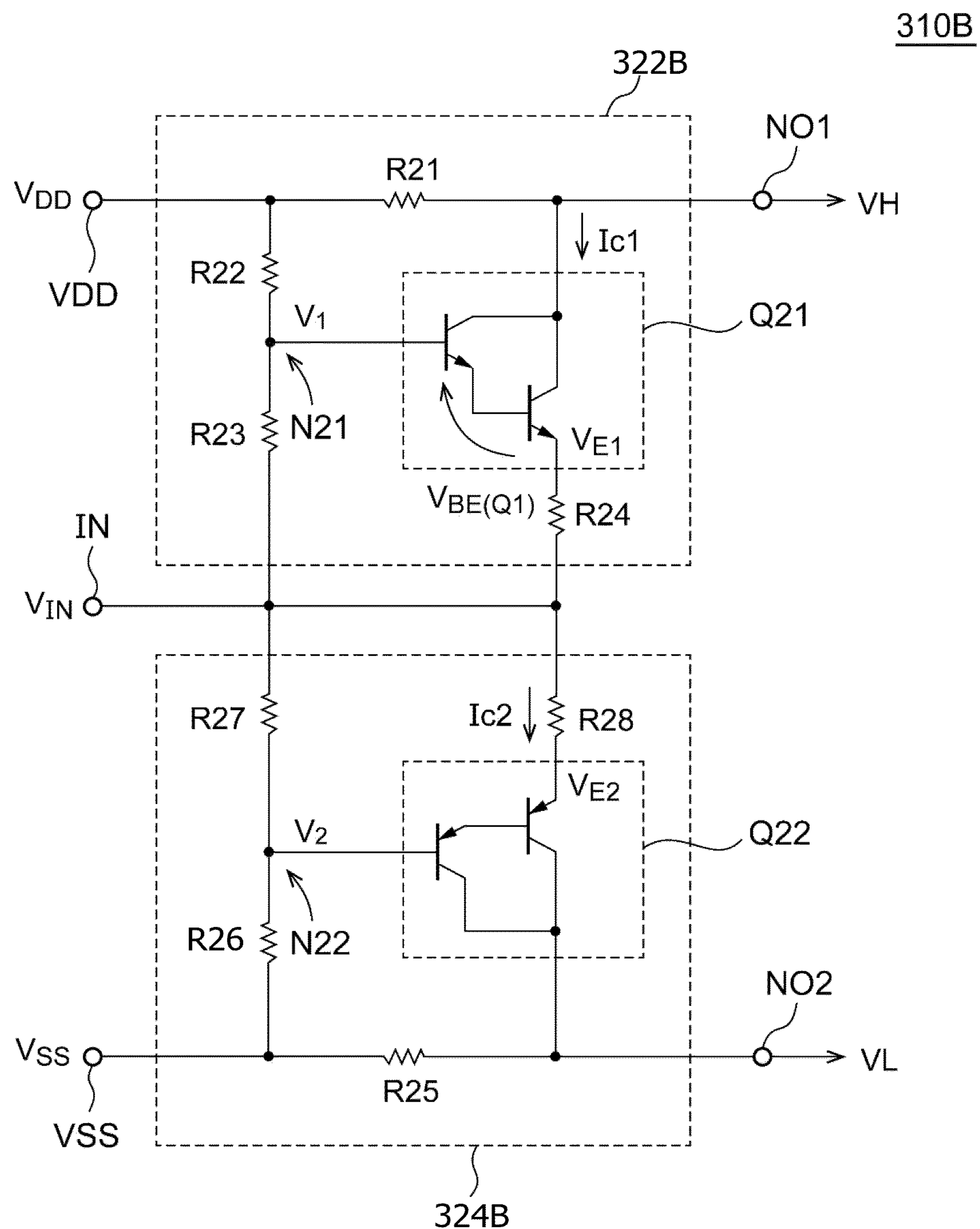
FIG. 8 is a circuit diagram of a controller according to embodiment example 2.

FIG. 8 is a circuit diagram of a controller 310B according to embodiment example 2. The controller 310B sets the high-side voltage VH to a fixed voltage VH_FIX that does not depend on the input voltage $V_{IN}$ when the voltage difference between the upper supply voltage $V_{DD}$ and the input voltage $V_{IN}$ is smaller than a predetermined first threshold. It is desirable to employ the upper supply voltage $V_{DD}$ as this fixed voltage VH_FIX. Similarly, the controller 310B sets the low-side voltage VL to a fixed voltage VL_FIX that does not depend on the input voltage $V_{IN}$ when the voltage difference between the lower supply voltage $V_{SS}$ and the input voltage $V_{IN}$ is smaller than a predetermined second threshold. It is desirable to employ the lower supply voltage $V_{SS}$ as this fixed voltage VL_FIX.

Specifically, the controller 310B includes a high-side voltage generating circuit 322B and a low-side voltage generating circuit 324B.

The high-side voltage generating circuit 322B includes a first resistor R21 to a fourth resistor R24 and a first transistor Q21. The first resistor R21 is disposed between the upper-side power supply terminal $V_{DD}$ and a first output node NO1 at which the high-side voltage VH is generated.

The second resistor R22 and the third resistor R23 are disposed in series between the upper-side power supply terminal VDD and the input terminal IN. In the first transistor Q21 of the NPN type, the base is connected to a first internal node N21 that connects the second resistor R22 and the third resistor R23 and the collector is connected to the first output node NO1. The transistor Q21 may be a Darlington transistor. The fourth resistor R24 is disposed between the emitter of the first transistor Q21 and the input terminal IN.

A fifth resistor R25 is disposed between the lower-side power supply terminal VSS and a second output node NO2 at which the low-side voltage VL is generated. A sixth resistor R26 and a seventh resistor R27 are disposed in series between the lower-side power supply terminal VSS and the input terminal IN. In a second transistor Q22 of the PNP type, the base is connected to a second internal node N22 that connects the sixth resistor R26 and the seventh resistor R27 and the collector is connected to the second output node NO2. An eighth resistor R28 is disposed between the emitter of the second transistor Q22 and the input terminal IN.

Operation of the high-side voltage generating circuit 322B will be described. At the first internal node N21, a first voltage $V_1$ arising from voltage dividing of the upper supply voltage $V_{DD}$ and the input voltage $V_{IN}$ is generated.

$$V_1=(V_{DD}\times R23+R22\times V_{IN})/(R22+R23) \tag{9}$$

The first transistor Q21 operates as an emitter follower and an emitter voltage $V_{E1}$ of the first transistor Q21 is represented by expression (10). $V_{BE(Q1)}$ is the base-emitter voltage of the first transistor Q21.

$$V_{E1}=V_1-V_{BE(Q1)} \tag{10}$$

A current that flows in the fourth resistor R24, i.e. a collector current Ic1 of the first transistor Q21, is represented by expression (11).

$$Ic1=(V_{E1}-V_{IN})/R24 \tag{11}$$

When this collector current Ic1 flows in the first resistor R21, a voltage drop is generated. The high-side voltage VH is represented by expression (12).

$$VH=V_{DD}-R21\times Ic1 \tag{12}$$

When expressions (9) to (11) are substituted into expression (12) and the resulting expression is rearranged, expression (13) is obtained.

$$VH=\left(1-\frac{R21}{R24}\frac{R23}{R22+R23}\right)V_{DD}-\frac{R21}{R24}\frac{R23}{R22+R23}V_{IN}-\frac{R21}{R24}V_{BE(Q1)} \tag{13}$$

Here, when the base-emitter voltage of the first transistor Q21 becomes lower than the threshold $V_{BE(Q1)}$, the first transistor Q21 is turned off and the flow of the current Ic1 stops. This state occurs when the potential difference between the upper supply voltage $V_{DD}$ and the input voltage $V_{IN}$ has become smaller than a certain threshold, specifically when $(V_{DD}-V_{IN})\times R23/(R22+R23)<V_{BE\ (Q1)}$ is satisfied. The high-side voltage VH at this time does not depend on the input voltage $V_{IN}$ and is equal to the upper supply voltage $V_{DD}$.

The low-side voltage generating circuit 324B also operates similarly to the high-side voltage generating circuit 322B. At the second internal node N22, a second voltage $V_2$ arising from voltage dividing of the lower supply voltage $V_{SS}$ and the input voltage $V_{IN}$ is generated.

$$V_2=(V_{SS}\times R27+R26\times V_{IN})/(R26+R27) \tag{14}$$

The second transistor Q22 operates as an emitter follower and an emitter voltage $V_{E2}$ of the second transistor Q22 is represented by expression (15). $V_{BE(Q2)}$ is the base-emitter voltage of the second transistor Q22.

$$V_{E2}=V_2+V_{BE(Q2)} \tag{15}$$

A current that flows in the eighth resistor R28, i.e. a collector current Ic2 of the second transistor Q22, is represented by expression (16).

$$Ic2=(V_{IN}-V_{E2})/R28 \tag{16}$$

When this collector current Ic2 flows in the fifth resistor R25, a voltage drop is generated. The low-side voltage VL is represented by expression (17).

$$VL=V_{SS}+R25\times Ic2 \tag{17}$$

When expressions (14) to (16) are substituted into expression (17) and the resulting expression is rearranged, expression (18) is obtained.

$$VL=\left(1-\frac{R25}{R28}\frac{R27}{R26+R27}\right)V_{SS}+\frac{R25}{R28}\frac{R27}{R26+R27}V_{IN}-\frac{R25}{R28}V_{BE(Q2)} \tag{18}$$

Here, when the base-emitter voltage of the second transistor Q22 becomes lower than the threshold $V_{BE(Q2)}$, the second transistor Q22 is turned off and the flow of the current Ic2 stops. This state occurs when the potential difference between the lower supply voltage $V_{SS}$ and the input voltage $V_{IN}$ has become smaller than a certain threshold, specifically when $(V_{IN}-V_{SS})\times R27/(R26+R27)<V_{BE(Q2)}$ is satisfied. The low-side voltage VL at this time does not depend on the input voltage $V_{IN}$ and is equal to the lower supply voltage $V_{SS}$.

By employing Darlington transistors as the first transistor Q21 and the second transistor Q22, the constant voltages $V_{BE(Q1)}$ and $V_{BE(Q2)}$ can be properly set based on the number of stages thereof.

Figure 9A:
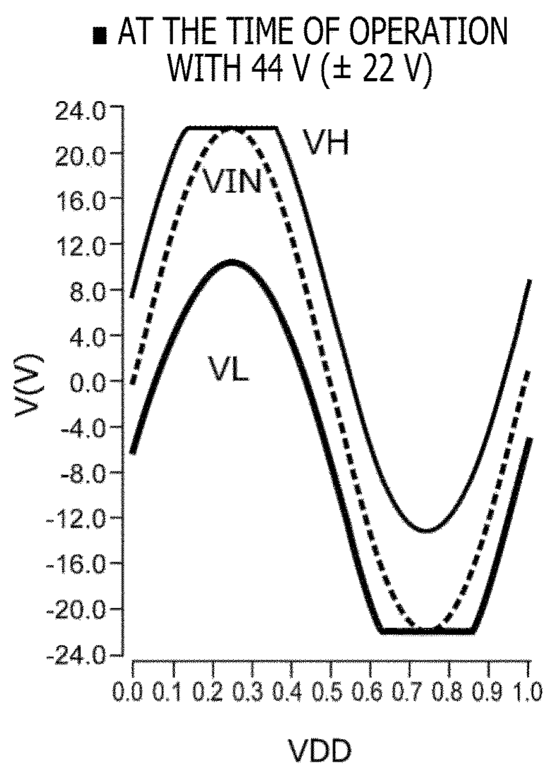
FIGS. 9A to 9C are diagrams for explaining operation of the controller in FIG. 8.
Figure 9B:
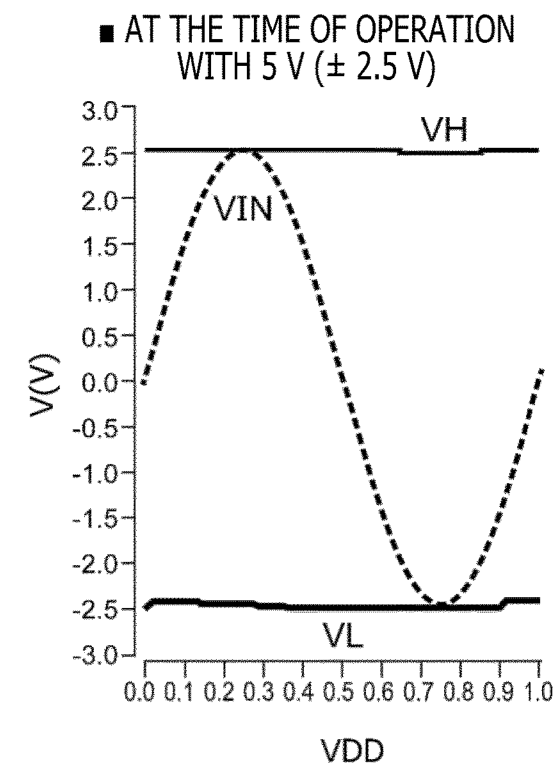
Figure 9C:
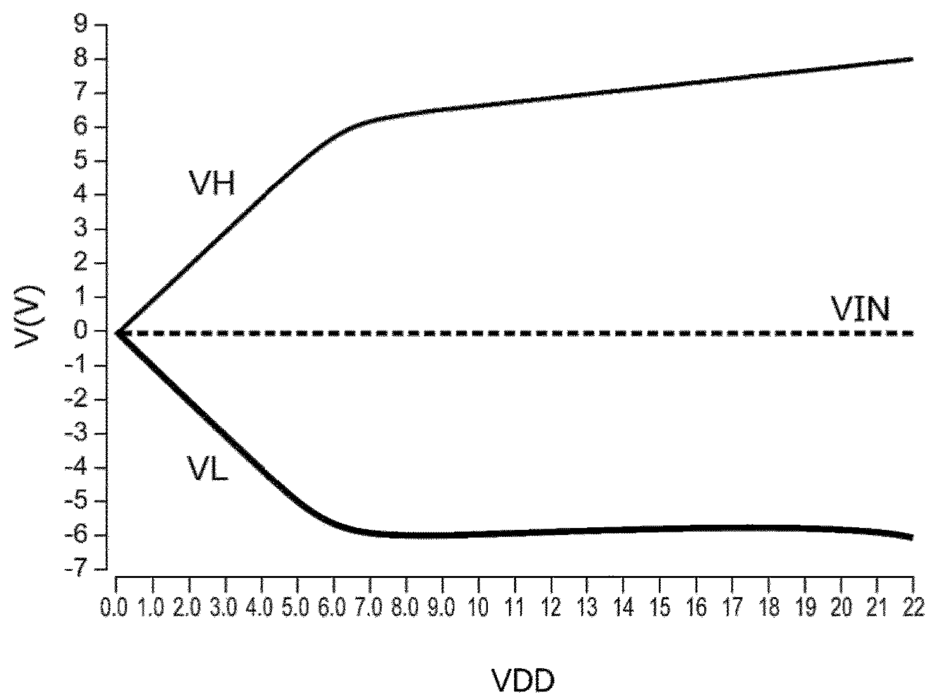
Figure 10A:
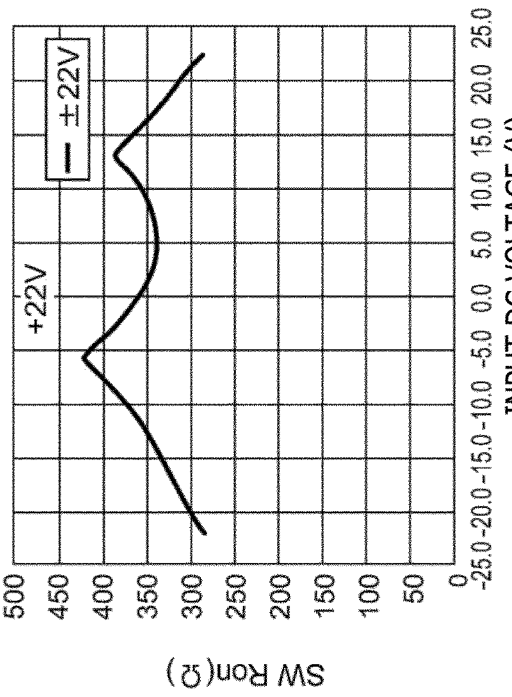
FIGS. 10A to 10D are diagrams depicting the on-resistance of the analog switch circuit when the controller in FIG. 8 is used.
Figure 10B:
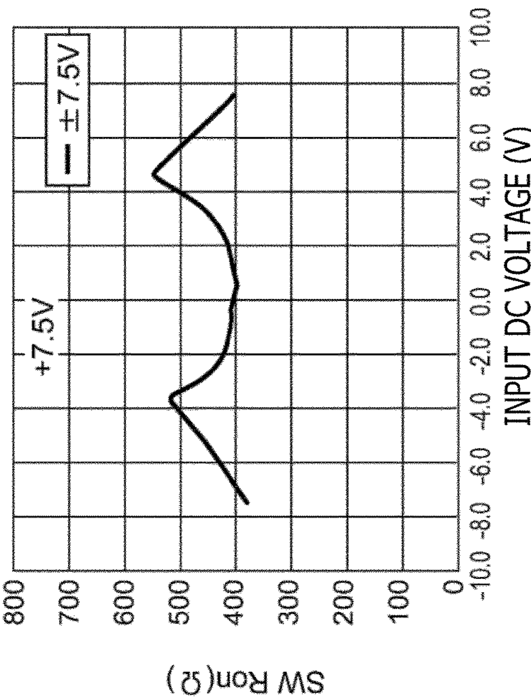
Figure 10C:
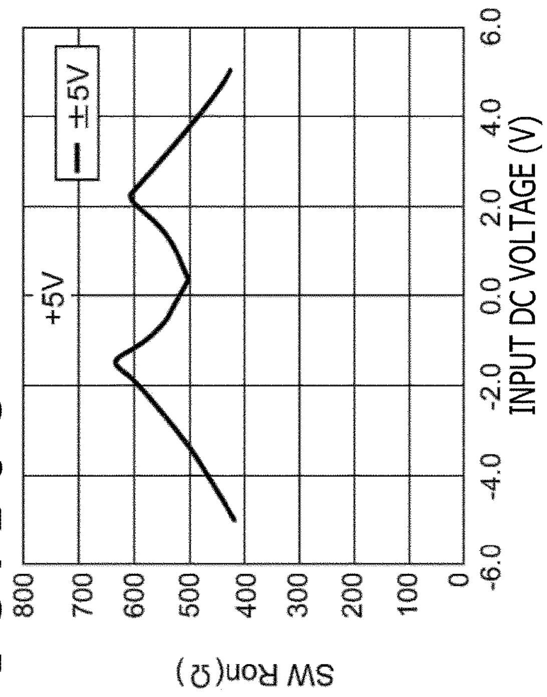
Figure 10D:
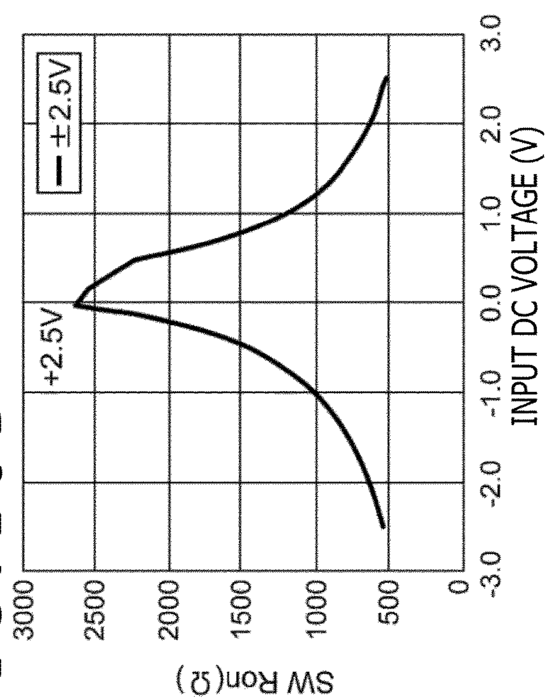

FIGS. 9A to 9C are diagrams for explaining the operation of the controller 310B in FIG. 8. FIGS. 9A and 9B depict the high-side voltage VH and the low-side voltage VL when the supply voltage $V_{DD}$ ($V_{SS}$) is set constant and the input voltage $V_{IN}$ of a sine wave is input. In FIG. 9A, the state in which the supply voltage $V_{DD}$ ($V_{SS}$) is sufficiently high and the currents Ic1 and Ic2 are flowing is depicted. In this state, the high-side voltage VH and the low-side voltage VL vary in such a manner as to follow the input voltage $V_{IN}$. FIG. 9B depicts the state in which the supply voltage $V_{DD}$ ($V_{SS}$) becomes low and the currents Ic1 and Ic2 do not flow is depicted. In this state, the high-side voltage VH and the low-side voltage VL do not depend on the input voltage $V_{IN}$ and are at constant levels.

FIG. 9C depicts the high-side voltage VH and the low-side voltage VL when the input voltage $V_{IN}$ is set constant at 0 V and the supply voltage $V_{DD}$ ($V_{SS}$) is changed. $VH=V_{DD}$ holds in a region of $V_{DD}<6$ V and $VL=V_{SS}$ holds in a region of $|V_{SS}|<6$ V.

FIGS. 10A to 10D are diagrams depicting the on-resistance of the analog switch circuit 300 when the controller 310B in FIG. 8 is used. FIGS. 10A to 10D depict the on-resistance when the supply voltages $V_{DD}$ and $V_{SS}$ are ±22 V, ±7.5 V, ±5 V, and ±2.5 V, respectively.

As is understood through contrasting FIGS. 10A to 10D with FIGS. 7A to 7D, according to embodiment example 2 in FIG. 8, the on-resistance of the analog switch can be made low when the supply voltage $V_{DD}$ ($V_{SS}$) becomes low. This makes it possible to use the analog switch circuit 300 in the state of the low supply voltage.

Embodiment Example 3

Figure 11:
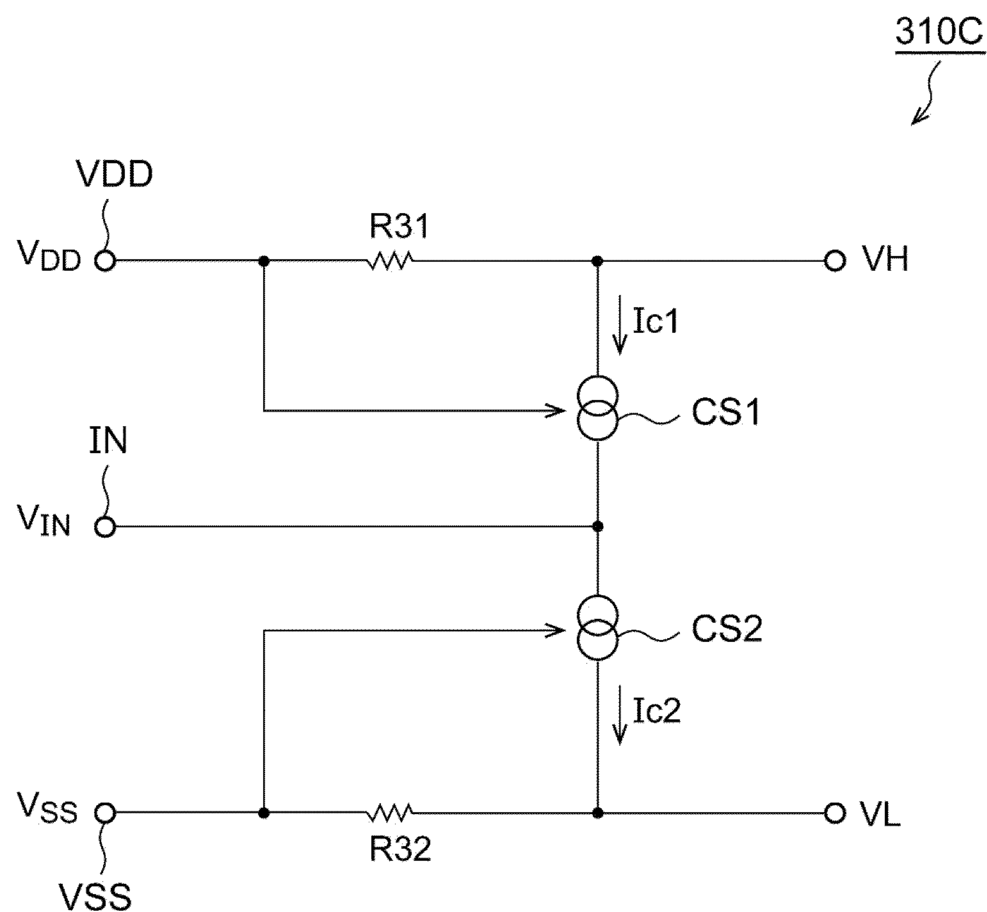
FIG. 11 is a circuit diagram of a controller according to embodiment example 3.

FIG. 11 is a circuit diagram of a controller 310C according to embodiment example 3. The controller 310C includes a first current source CS1, a second current source CS2, a first resistor R31, and a second resistor R32. The first resistor R31 and the second resistor R32 correspond to the resistors R21 and R25 in FIG. 8.

The first current source CS1 generates the current Ic1 according to the difference between the upper supply voltage $V_{DD}$ and the input voltage $V_{IN}$ and is turned off when the difference between the upper supply voltage $V_{DD}$ and the input voltage $V_{IN}$ becomes smaller than a predetermined threshold. This first current source CS1 can be associated with the resistors R22, R23, and R24 and the first transistor Q21 in FIG. 8.

Similarly, the second current source CS2 generates the current Ic2 according to the difference between the input voltage $V_{IN}$ and the lower supply voltage $V_{SS}$ and is turned off when the difference between the input voltage $V_{IN}$ and the lower supply voltage $V_{SS}$ becomes smaller than a predetermined threshold. The second current source CS2 can be associated with the resistors R26, R27, and R28 and the second transistor Q22 in FIG. 8.

Subsequently, a use purpose of the analog switch circuit 300 will be described. The analog switch circuit 300 can be used for a volume circuit.

Figure 12:
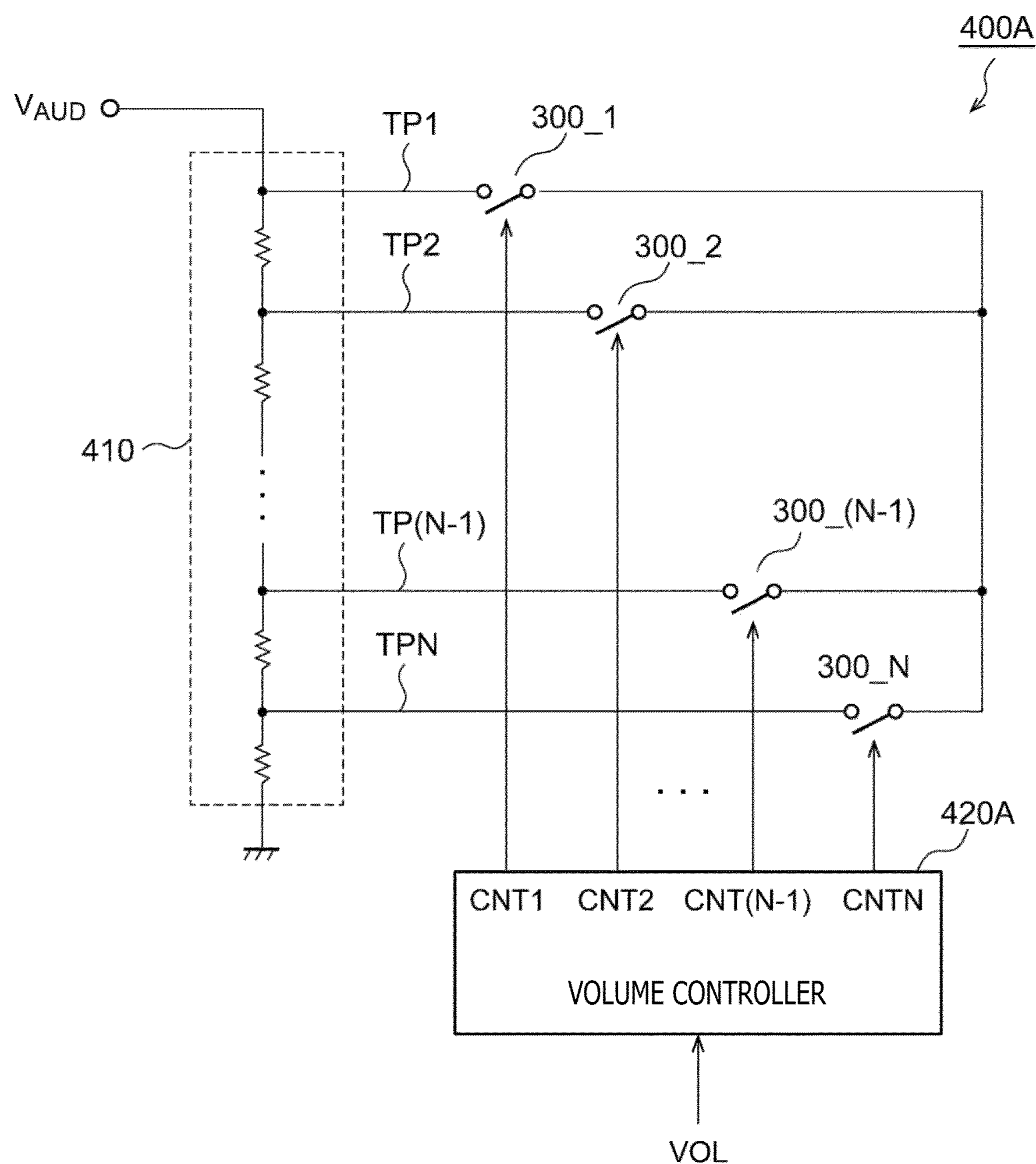
FIG. 12 is a circuit diagram of a volume circuit including the analog switch circuits.

FIG. 12 is a circuit diagram of a volume circuit 400A including the analog switch circuits 300. The volume circuit 400A is integrated into an audio IC. The volume circuit 400A includes a resistance voltage dividing circuit 410, plural analog switch circuits 300_1 to 300_N (N≥2), and a volume controller 420A. The resistance voltage dividing circuit 410 includes plural resistors connected in series and carries out voltage dividing of an audio input signal $V_{AUD}$. The plural analog switch circuits 300_1 to 300_N are connected to taps TP1 to TPN led out from the resistance voltage dividing circuit 410. The volume controller 420A generates control signals CNT1 to CNTN in such a manner that one according to a setting value VOL of the volume in the plural analog switch circuits 300_1 to 300_N is turned on. In this configuration, each analog switch circuit 300_*i* (i=1 to N) may operate by using the voltage after the voltage dividing that appears in the corresponding tap TPi as the input voltage $V_{IN}$.

Embodiment Example 4

In the volume circuit 400A in FIG. 12, each of the analog switch circuits 300 includes the controller 310 and the circuit area becomes larger when the number N of taps TP increases. Thus, in embodiment example 4, description will be made about a multi-input analog switch circuit (multiplexer) 500 suitable when the number of taps TP is large.

Figure 13:
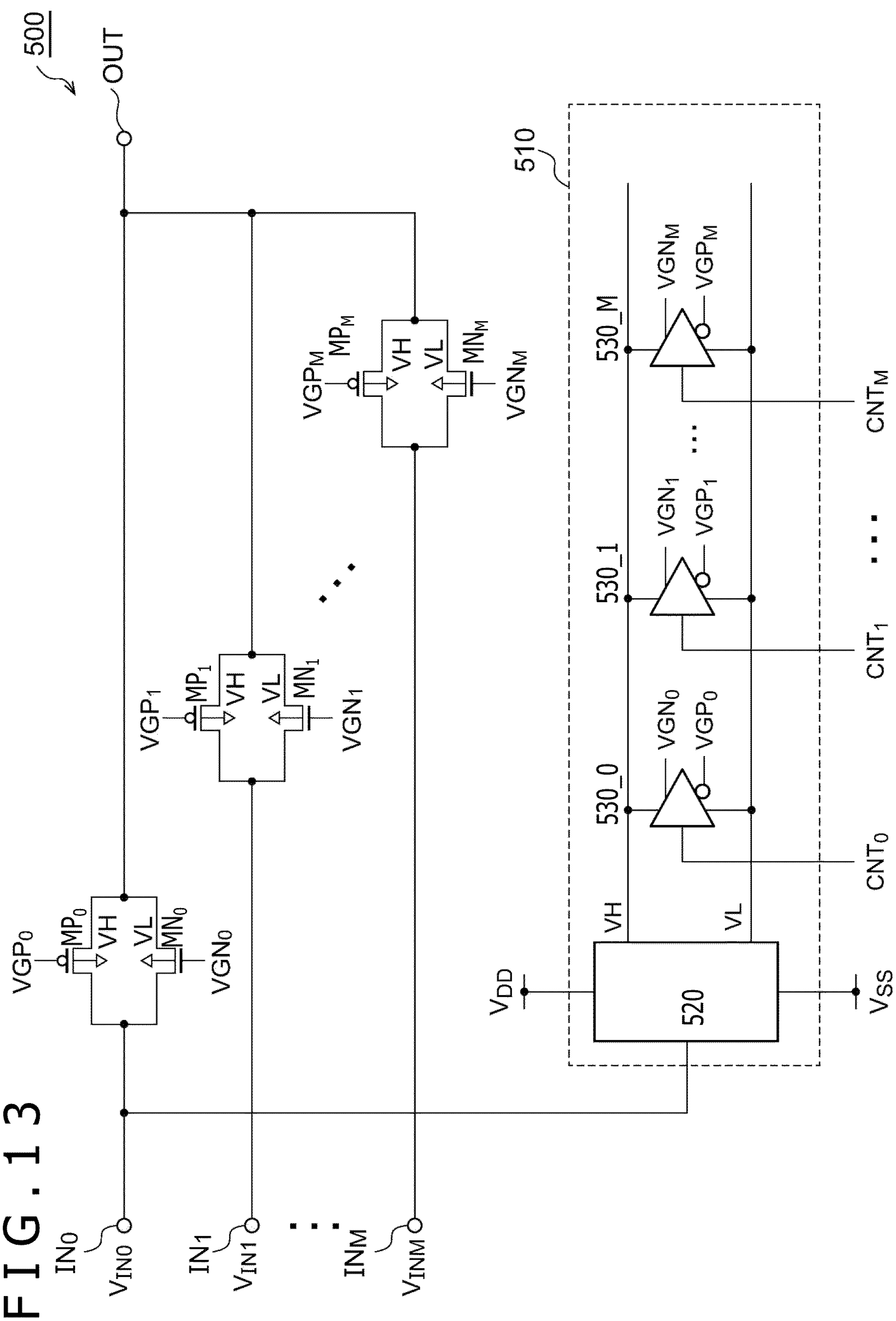
FIG. 13 is a circuit diagram of a multiplexer according to embodiment example 4.

FIG. 13 is a circuit diagram of the multiplexer 500 according to embodiment example 4. The multiplexer 500 has a main input terminal $IN_0$ and sub-input terminals $IN_1$ to $IN_M$ and has M+1 input terminals in total. An input voltage $VIN_0$ is supplied to the main input terminal $IN_0$. To the sub-input terminals $IN_1$ to $IN_M$, sub-input voltages $V_{IN1}$ to $V_{INM}$ arising from voltage dividing of the input voltage $VIN_0$ at different voltage division ratios are supplied. The multiplexer 500 selects one according to plural control signals $CNT_0$ to $CNT_M$ in the plural input voltages $V_{IN0}$ to $V_{INM}$ and outputs the selected signal from an output terminal OUT.

The multiplexer 500 includes a main NMOS transistor $MN_0$, a main PMOS transistor $MP_0$, M sub-NMOS transistors $MN_1$ to $MN_M$, M sub-PMOS transistors $MP_1$ to $MP_M$, and a controller 510.

The controller 510 includes a voltage generating circuit 520, a main driver 530_0, and M sub-drivers 530_1 to 530_M.

The main NMOS transistor $MN_0$, the main PMOS transistor $MP_0$, the voltage generating circuit 520, and the main driver 530_0 correspond to the NMOS transistor 302, the PMOS transistor 304, the voltage generating circuit 320, and the driver 330, respectively, in FIG. 3. Therefore, the voltage generating circuit 520 generates the high-side voltage VH and the low-side voltage VL.

The driver 530_# (#=0, 1, . . . M) generates gate signals $VGN_\#$ and $VGP_\#$ of the pair of the corresponding NMOS transistor $MN_\#$ and PMOS transistor $MP_\#$ according to the corresponding control signal $CNT_\#$. The gate signals $VGN_\#$ and $VGP_\#$ can take one of the high-side voltage VH and the low-side voltage VL.

The low-side voltage VL is supplied to the back gates of the plural NMOS transistors $MN_0$ to $MN_M$ and the high-side voltage VH is supplied to the back gates of the plural PMOS transistors $MP_0$ to $MP_M$.

The above is the configuration of the multiplexer 500. According to this multiplexer 500, the voltage generating circuit 520 can be allowed to be shared by the plural input terminals. Therefore, the circuit area can be reduced compared with the case of configuring the multiplexer through arranging plural analog switch circuits 300.

Figure 14:
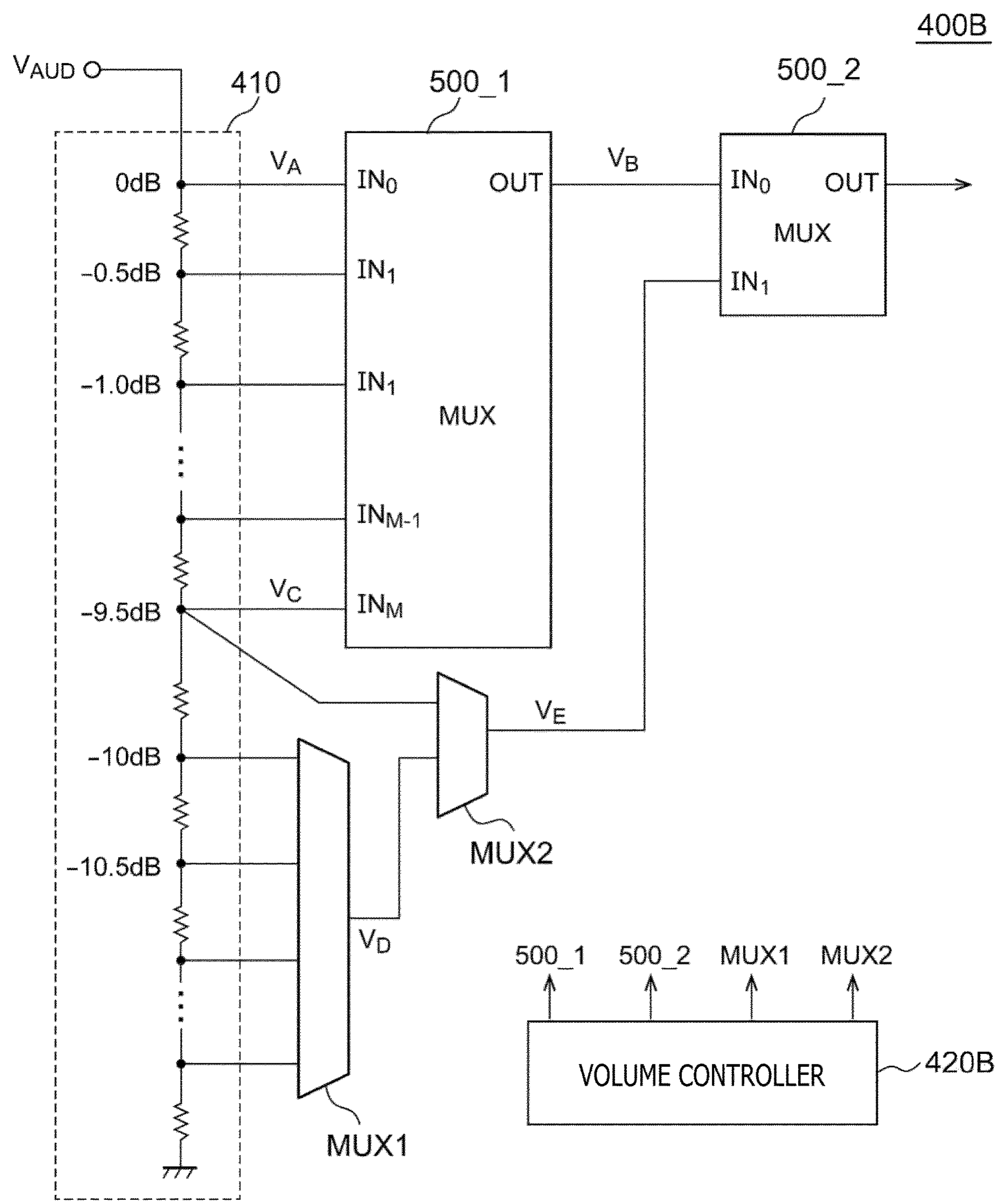
FIG. 14 is a circuit diagram of a volume circuit including the analog switch circuits.

FIG. 14 is a circuit diagram of a volume circuit 400B including the analog switch circuits 300. The volume circuit 400B includes the resistance voltage dividing circuit 410, a volume controller 420B, and multiplexers 500_1, 500_2, MUX1, and MUX2. The volume circuit 400B is integrated into an audio IC.

The resistance voltage dividing circuit 410 includes plural resistive elements connected in series, and an audio input signal $V_{AUD}$ is applied to one end thereof.

The multiplexer 500_1 is disposed in association with upper-level plural taps of the resistance voltage dividing circuit 410. The multiplexer MUX1 is disposed in association with lower-level plural taps of the resistance voltage dividing circuit 410. The multiplexer MUX2 receives a voltage $V_C$ of the lowest tap in the upper-level plural taps and an output voltage $V_D$ of the multiplexer MUX1. The multiplexer 500_2 receives an output voltage $V_B$ of the multiplexer 500_1 and an output $V_E$ of the multiplexer MUX2.

The volume controller 420B controls the multiplexers 500_1, 500_2, MUX1, and MUX2 according to a setting value VOL of the volume. For example, the voltage division ratio of the resistance voltage dividing circuit 410 is designed in 0.5 dB increments and the upper-level taps of 0 dB to −9.5 dB are connected to the multiplexer 500_1. In this case, the number M of sub-input terminals of the multiplexer 500_1 is 19. The voltages of the lower-level taps of −10 dB or lower are input to the multiplexer MUX1.

The multiplexer 500_1 and the multiplexer 500_2 are configured by using the architecture of FIG. 13. Therefore, the multiplexer 500_1 operates by using the voltage $V_A$ ($=V_{AUD}$) as the main input voltage and the multiplexer 500_2 operates by using the output voltage $V_B$ of the multiplexer 500_1 as the main input voltage.

On the other hand, regarding the multiplexers MUX1 and MUX2, the amplitude of the voltage input to them is small and therefore the back gate voltages of the CMOS switch may be fixed at constant levels (for example, ±7.5 V).

When the setting value VOL of the volume is changed, the volume controller 420B sequentially selects the taps from the tap corresponding to the volume value before the change to the tap corresponding to the volume value after the change in one-step (0.5 dB) increments.

In order for the multiplexer 500_2 to normally operate, a voltage may need to be constantly applied to the main input terminal $IN_0$. Thus, when the voltage of the lower-level tap (−9.5 dB or lower) is selected, the multiplexer 500_1 selects the voltage $V_C$ of the sub-input terminal $IN_N$ of the lowest level and operates in such a manner that the voltage $V_C$ is supplied to the main input terminal $IN_0$ of the multiplexer 500_2.

The present disclosure is described above based on the embodiment. This embodiment is exemplification and it is understood by those skilled in the art that various modification examples are possible in combinations of the respective constituent elements and the respective processing processes of the embodiment and such modification examples also fall within the range of the present disclosure. Such modification examples will be described below.

Modification Example 1

In the embodiment, the upper supply voltage $V_{DD}$ is set to a positive voltage and the lower supply voltage $V_{SS}$ is set to a negative voltage. However, the configuration is not limited thereto. For example, the upper supply voltage $V_{DD}$ may be set to a positive voltage and the lower supply voltage $V_{SS}$ may be set to a ground voltage (0 V). The upper supply voltage $V_{DD}$ may be set to a ground voltage (0 V) and the lower supply voltage $V_{SS}$ may be set to a negative voltage.

Modification Example 2

In FIG. 2, while the low-side voltage VL and the high-side voltage VH are applied to the back gates of the NMOS transistor 302 and the PMOS transistor 304, voltages VH' and VL' slightly different from the high-side voltage VH and the low-side voltage VL may be applied to the gates of them. For example, VH' and VL' may be voltages arising from level shift of VH and VL or may be voltages arising from voltage dividing of VH and VL.

Alternatively, while the low-side voltage VL and the high-side voltage VH are applied to the gates of the NMOS transistor 302 and the PMOS transistor 304, voltages VH' and VL' slightly different from the high-side voltage VH and the low-side voltage VL may be applied to the back gates of them.

Although the present disclosure is described based on the embodiment with use of specific phrases, the embodiment merely depicts the principle and application of the present disclosure. In the embodiment, many modification examples and change in the arrangement are permitted without departing from ideas of the present disclosure defined in the scope of claims.

What is claimed is:

1. An analog switch circuit that allows switching between an on-state and an off-state according to a control signal, the analog switch circuit comprising:

a main input terminal that receives an input voltage;

an output terminal;

an upper-side power supply terminal that receives an upper supply voltage;

a lower-side power supply terminal that receives a lower supply voltage;

a main N-channel MOS transistor and a main P-channel MOS transistor that are disposed in parallel between the main input terminal and the output terminal, MOS standing for metal oxide semiconductor; and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage.

2. The analog switch circuit according to claim 1, wherein the controller applies the high-side voltage to the gate of the main N-channel MOS transistor and applies the low-side voltage to the gate of the main P-channel MOS transistor when the control signal is at a first level, and the controller applies the low-side voltage to the gate of the main N-channel MOS transistor and applies the high-side voltage to the gate of the main P-channel MOS transistor when the control signal is at a second level.

3. The analog switch circuit according to claim 1, wherein the controller applies the low-side voltage to the back gate of the main N-channel MOS transistor, and the controller applies the high-side voltage to the back gate of the main P-channel MOS transistor.

4. The analog switch circuit according to claim 1, wherein the high-side voltage is a voltage arising from voltage dividing of the upper supply voltage and the input voltage, and the low-side voltage is a voltage arising from voltage dividing of the input voltage and the lower supply voltage.

5. The analog switch circuit according to claim 1, wherein the high-side voltage is a voltage obtained by offsetting the upper supply voltage according to difference from the input voltage, and the low-side voltage is a voltage obtained by offsetting the lower supply voltage according to difference from the input voltage.

6. The analog switch circuit according to claim 1, wherein when the high-side voltage is defined as VH and the low-side voltage is defined as VL and the upper supply voltage is defined as $V_{DD}$ and the lower supply voltage is defined as $V_{SS}$ and the input voltage is defined as $V_{IN}$ and $a_1$, $a_2$, $b_1$, $b_2$, $V_{c1}$, and $V_{c2}$ are deemed as constants, following expressions are satisfied, $$VH=a_1 \cdot V_{IN}+b_1 \cdot V_{DD}+Vc_1$$

$$VL=a_2 \cdot V_{IN}+b_2 \cdot V_{SS}+Vc_2$$

where the $a_1$, $a_2$, $b_1$, and $b_2$ are not zero.

7. The analog switch circuit according to claim 1, wherein the high-side voltage becomes a first fixed voltage that does not depend on the input voltage when voltage difference between the upper supply voltage and the input voltage is smaller than a predetermined first threshold, and the low-side voltage becomes a second fixed voltage that does not depend on the input voltage when voltage difference between the lower supply voltage and the input voltage is smaller than a predetermined second threshold.

8. The analog switch circuit according to claim 7, wherein the first fixed voltage is the upper supply voltage, and the second fixed voltage is the lower supply voltage.

9. The analog switch circuit according to claim 1, wherein the voltage generating circuit includes a first resistor disposed between the upper-side power supply terminal and a first output node at which the high-side voltage is generated, a second resistor and a third resistor disposed in series between the upper-side power supply terminal and the main input terminal, a first transistor of an negative-positive-negative type in which a base is connected to a first internal node that connects the second resistor and the third resistor and a collector is connected to the first output node, a fourth resistor disposed between an emitter of the first transistor and the main input terminal, a fifth resistor disposed between the lower-side power supply terminal and a second output node at which the low-side voltage is generated, a sixth resistor and a seventh resistor disposed in series between the lower-side power supply terminal and the main input terminal, a second transistor of a positive-negative-positive type in which a base is connected to a second internal node that connects the sixth resistor and the seventh resistor and a collector is connected to the second output node, and an eighth resistor disposed between an emitter of the second transistor and the main input terminal.

10. The analog switch circuit according to claim 9, wherein the first transistor and the second transistor are Darlington transistors.

11. The analog switch circuit according to claim 1, wherein the voltage generating circuit includes a first resistor whose one end is connected to the upper-side power supply terminal, a first current source that causes a current according to difference between the upper supply voltage and the input voltage to flow in the first resistor, a second resistor whose one end is connected to the lower-side power supply terminal, and a second current source that causes a current according to difference between the input voltage and the lower supply voltage to flow in the second resistor, the high-side voltage is generated at the other end of the first resistor, and the low-side voltage is generated at the other end of the second resistor.

12. The analog switch circuit according to claim 11, wherein the first current source is turned off when the upper supply voltage becomes lower than a predetermined first threshold, and the second current source is turned off when the lower supply voltage becomes lower than a predetermined second threshold.

13. The analog switch circuit according to claim 1, further comprising:

at least one sub-main input terminal that each receives a voltage arising from voltage dividing of the input voltage;

at least one sub-N-channel MOS transistor each disposed between corresponding one of the at least one sub-main input terminal and the output terminal; and at least one sub-P-channel MOS transistor each disposed between corresponding one of the at least one sub-main input terminal and the output terminal, wherein the low-side voltage is applied to a back gate of the at least one sub-N-channel MOS transistor and the high-side voltage is applied to a back gate of the at least one sub-P-channel MOS transistor.

14. An analog switch circuit that allows switching between interruption and conduction according to a control signal, the analog switch circuit comprising:

a main input terminal that receives an input voltage;

an output terminal;

an upper-side power supply terminal that receives an upper supply voltage;

a lower-side power supply terminal that receives a lower supply voltage;

a main N-channel MOS transistor and a main P-channel MOS transistor that are disposed in parallel between the main input terminal and the output terminal, MOS standing for metal oxide semiconductor;

a first driver that applies one according to the control signal in a high-side voltage and a low-side voltage to a gate of the main N-channel MOS transistor;

a second driver that applies the other according to the control signal in the high-side voltage and the low-side voltage to a gate of the main P-channel MOS transistor;

a first resistor disposed between the upper-side power supply terminal and a first output node at which the high-side voltage is generated;

a second resistor and a third resistor disposed in series between the upper-side power supply terminal and the main input terminal;

a first transistor of a negative-positive-negative type in which a base is connected to a first internal node that connects the second resistor and the third resistor and a collector is connected to the first output node;

a fourth resistor disposed between an emitter of the first transistor and the main input terminal;

a fifth resistor disposed between the lower-side power supply terminal and a second output node at which the low-side voltage is generated;

a sixth resistor and a seventh resistor disposed in series between the lower-side power supply terminal and the main input terminal;

a second transistor of a positive-negative-positive type in which a base is connected to a second internal node that connects the sixth resistor and the seventh resistor and a collector is connected to the second output node; and an eighth resistor disposed between an emitter of the second transistor and the main input terminal.

15. A volume circuit comprising:

a resistance voltage dividing circuit that includes a plurality of resistive elements connected in series and has one end to which an input signal is applied;

a plurality of analog switch circuits disposed corresponding to a plurality of taps of the resistance voltage dividing circuit; and a volume controller that controls the plurality of the analog switch circuits, wherein at least one of the plurality of the analog switch circuits is an analog switch circuit that allows switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, MOS standing for metal oxide semiconductor, and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage.

16. A volume circuit comprising:

a resistance voltage dividing circuit that includes a plurality of resistive elements connected in series and has one end to which an input signal is applied; and an analog switch circuit that receives voltages of a plurality of taps of the resistance voltage dividing circuit, the analog switch circuit allowing switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, MOS standing for metal oxide semiconductor, and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage, at least one sub-main input terminal that each receives a voltage arising from voltage dividing of the input voltage, at least one sub-N-channel MOS transistor each disposed between corresponding one of the at least one sub-main input terminal and the output terminal, and at least one sub-P-channel MOS transistor each disposed between corresponding one of the at least one sub-main input terminal and the output terminal, wherein the low-side voltage is applied to a back gate of the at least one sub-N-channel MOS transistor and the high-side voltage is applied to a back gate of the at least one sub-P-channel MOS transistor.

17. A semiconductor integrated circuit comprising:

a volume circuit including a resistance voltage dividing circuit that includes a plurality of resistive elements connected in series and has one end to which an input signal is applied, a plurality of analog switch circuits disposed corresponding to a plurality of taps of the resistance voltage dividing circuit, and a volume controller that controls the plurality of the analog switch circuits, wherein at least one of the plurality of the analog switch circuits is an analog switch circuit that allows switching between an on-state and an off-state according to a control signal, the analog switch circuit including a main input terminal that receives an input voltage, an output terminal, an upper-side power supply terminal that receives an upper supply voltage, a lower-side power supply terminal that receives a lower supply voltage, a main N-channel MOS transistor and a main P-channel MOS transistor that are disposed in parallel between the main input terminal and the output terminal, MOS standing for metal oxide semiconductor, and a controller that includes a voltage generating circuit that generates a high-side voltage according to the upper supply voltage and the input voltage and a low-side voltage according to the input voltage and the lower supply voltage, the controller being capable of controlling a gate and a back gate of each of the main N-channel MOS transistor and the main P-channel MOS transistor based on the high-side voltage and the low-side voltage.

* * * * *